United States Patent [19]

Breece

[11] Patent Number: 4,616,286

[45] Date of Patent: Oct. 7, 1986

[54] POWER LINE FILTER

[75] Inventor: Lee K. Breece, McLean, Va.

[73] Assignee: Puroflow Corporation, Santa Monica, Calif.

[21] Appl. No.: 681,068

[22] Filed: Dec. 12, 1984

Related U.S. Application Data

[63] Continuation of Ser. No. 403,937, Aug. 2, 1982, abandoned.

[51] Int. Cl.$^4$ ............................................. H02H 9/04
[52] U.S. Cl. ...................................... 361/56; 361/89; 361/91; 361/111; 361/118
[58] Field of Search ................... 361/56, 91, 111, 89, 361/104, 119, 118

[56] References Cited

U.S. PATENT DOCUMENTS

| | | | |
|---|---|---|---|
| 3,546,572 | 12/1970 | Specht et al. | 361/111 |
| 3,660,719 | 5/1972 | Grenier | 361/56 |
| 3,793,535 | 2/1974 | Chowdhuri | 361/111 |
| 3,934,175 | 1/1976 | Clark | 361/56 |
| 4,023,071 | 5/1977 | Fussell | 361/56 |
| 4,254,442 | 3/1981 | Dijkmans et al. | 361/56 |
| 4,259,705 | 3/1981 | Stifter . | |

Primary Examiner—A. D. Pellinen
Assistant Examiner—Jeffrey A. Gaffin
Attorney, Agent, or Firm—Staas & Halsey

[57] ABSTRACT

A power line filter suppresses or dissipates and clamps short rise time high voltage transients carried by power transmission lines. The power line filter includes one or more modules connected to either direct current or alternating current power lines to protect sensitive electrical equipment from the transients. The module used with a direct current power line includes a capacitor, a selenium surge suppressor and a metal oxide varistor connected in parallel. The module used with an alternating current power line includes a capacitor, a selenium surge suppressor and a gas tube connected in parallel. The module used with the alternating current power line can also include a metal oxide varistor also connected in parallel. The alternating current power line filter modules can be connected to single phase, two-phase or three-phase wye and delta power systems. The power line filter module provides instantaneous reaction to noise transients and a broad range of energy dissipation or shunting capability, along with a fail open function when a catastrophic failure of the filter occurs.

13 Claims, 10 Drawing Figures

POWER LINE FILTER

This is a continuation of copending application Ser. No. 403,937, filed on Aug. 2, 1982, now abandoned.

BACKGROUND OF THE INVENTION

The present invention relates to a filter for filtering and suppressing transient surge and impulse voltages and currents on power lines and, in particular, to a filter for instantaneously filtering impulse noise signals applied to a power line from such sources as lightning, nuclear explosions and large equipment switching surges in order to protect sensitive electronic equipment connected to the power line.

Communications equipment, computers, military targeting systems, home stereo amplifiers, televisions and other electronic devices are increasingly characterized by small electrical contacts and miniature components which are very vulnerable to interference or damage from stray electrical energy carried by power lines. Unpredictable variations in power line voltage changes the operating range and can severely damage or destroy such electronic devices. These electronic devices are very expensive to repair or replace and therefore, require cost effective transient protection.

One source of harmful electrical energy is lightning. Lightning is a very complex electromagnetic energy source having potentials estimated at from five million to twenty million volts and currents reaching thousands of amperes. A lightning stroke generally contains a series of pulses each having a duration of from a nanosecond to several milliseconds. A typical "8/20" lightning pulse lasts for a period of 40 microseconds and has a peak current of 20,000 amps which is reached in 8 microseconds.

Another source of unwanted electromagnetic energy is a nuclear electromagnetic pulse. An electromagnetic pulse generated by a nuclear detonation produces intense transient electric and magnetic fields with very short rise times and a frequency spectrum extending from approximately zero to more than 100 megahertz. The electromagnetic pulse from a high altitude explosion typically has a maximum field strength near the ground on the order of 50 kilovolts per meter, a time duration of one microsecond and a rise time of nanoseconds.

Other sources of impulse noise are switching transients caused by turning on and off large banks of equipment and large motors, and ground loop interference caused by varying ground potentials.

The above-mentioned noise transients can be coupled to a sensitite electronic device by external or internal coupling. In external coupling an electromagnetic wave or a lightning pulse impinges on a receiver, such as a power transmission line or system, and the transient voltage induced in the receiver is passed through transformers, rectifiers and other voltage and current altering devices to the sensitive electronic device. The passage of the transient through such devices as transformers alters the original waveform increasing the current levels, the voltage levels and the frequency spectrum. The characteristics of the transient reaching the sensitive equipment can be hard to predict because of the intermediate coupling devices, thereby making the transient hard to remove. Thus, there is a need in the art for a filtering device that has a broad range of energy absorption and/or shunting capability which responds instantaneously to any type of undesired noise transient.

SUMMARY OF THE INVENTION

It is an object of the present invention to provide a power line filter capable of suppressing large short rise time transient impulses, so as to protect sensitive electronic equipment.

It is another object of the present invention to provide a power line filter having an instantaneous response or zero time delay.

It is a further object of the present invention to provide a power line filter having a broad range of transient surge suppression and shunting capability.

It is another object of the present invention to provide a power line filter having the ability to suppress high frequency interference capable of causing damage to sensitive electrical equipment.

It is a still further object of the present invention to provide a power line filter which, if it fails, fails in an open electrical condition so that the failure of the power line filter will not disable the electronic equipment to which it is connected.

It is still another object of the present invention to provide a power line filter for filtering electrical ground loop noise interference.

It is moreover another object of the present invention to provide a power line filter applicable to all types of power lines including: alternating current single phase, two-phase, three-phase wye and delta power lines; and direct current power lines.

The power line filter of the present invention can be connected to protect a direct current powered device or an alternating current powered device. When connected to protect an alternating current device, the power line filters include one or more capacitors, a selenium surge suppressor and a gas tube all connected in parallel. An alternative embodiment of the alternating current power line filter includes one or more capacitors, a selenium surge suppressor, a metal oxide varistor and a gas tube all connected in parallel. The alternating current power line filter module can be connected to protect single phase, two-phase and three-phase powered electronic equipment for power systems of both the wye and delta type. When connected to protect a direct current device the power line filter includes one or more capacitors, a selenium surge suppressor and a metal oxide varistor all connected in parallel.

The various embodiments of the present invention provide instantaneous and substantially complete protection of sensitive equipment from unwanted noise transients coupled through a power line.

These together with other objects and advantages which will be apparent, reside in the details of construction and operation as fully hereinafter described and claimed, reference being had to the accompanying drawings forming apart hereof, wherein like numerals refer to like parts throughout.

DESCRIPTION OF THE PREFERRED EMBODIMENTS

Figure 1:
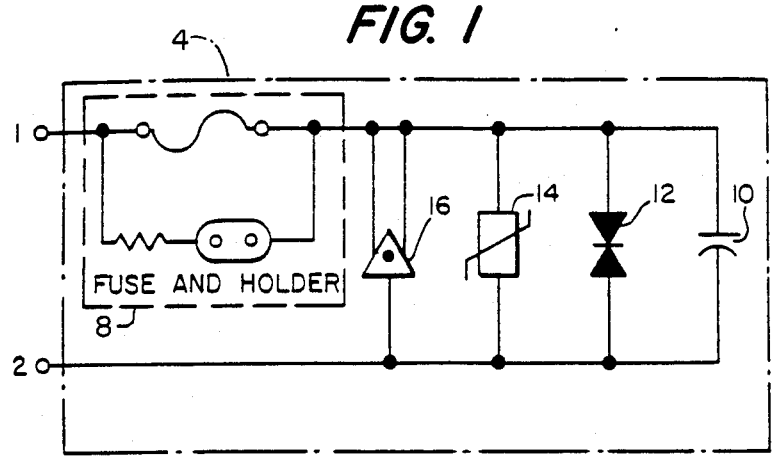
FIG. 1 is a circuit diagram of an embodiment of the power line filter of the present invention.

FIG. 1 illustrates one embodiment of an alternating current power line filter 4 according to the present invention that can be connected to protect sensitive equipment using three-phase, two-phase or single-phase power. Sensitive equipment, such as computers, televisions and communication devices, may have, for example, transistors and memory units damaged or destroyed by changes in power line voltage which can cause transistors to short and memory units to lose information stored therein. If, for example, the equipment being protected is connected to a two-phase power system, terminal 1 is connected to one of the phases and terminal 2 is connected to the other phase, that is, the power line filter 4 is connected in parallel with the equipment being protected. As another example, if the power line filter 4 is used to protect a home stereo amplifier, terminals 1 and 2 are respectively connected to the pair of wires that supply power to the stereo unit.

The power line filter circuit 4 includes a capacitor 10 connected between terminals 1 and 2, a selenium surge suppressor 12 connected between terminals 1 and 2, a metal oxide varistor 14 connected between terminals 1 and 2, and a gas tube 16 connected between terminals 1 and 2. Although FIG. 1 illustrates only a single capacitor 10 it should be noted that the capacitor 10 may comprise a plurality of capacitors connected in parallel. The elements illustrated in FIG. 1 operate separately, sequentially and in parallel in dependence upon the magnitude and duration of a noise transient. When the noise transient impinges on the power lines of the sensitive equipment, (e.g., the pair of wires providing power to the stereo unit) each of the elements connected between the first and second filter terminals has the same voltage across it, that is, capacitor 10, selenium surge suppressor 12, metal oxide varistor 14 and gas tube 16, because they are connected in parallel, have the same potential applied thereto. As the transient is received by the power line filter 4, the line voltage between terminals 1 and 2 begins to rise above the normal peak voltage of the power line and capacitor 10 begins to store the excess energy. The storage of the excess energy causes the waveform of the transient to begin to flatten. During this phase where capacitor 10 is the primary suppression or blocking device, the remainder of the elements (i.e., selenium surge suppressor 12, metal oxide varistor 14 and gas tube 16) are conducting only very slightly and therefore their effects on the transient can be generally ignored. As the line voltage continues to rise the voltage firing threshold of selenium surge suppressor 12 is reached and passed, and after a delay period of several nanoseconds, selenium surge suppressor 12 enters a substantial conduction phase and flattens the transient waveform further by shunting a portion of the transient and clamping the line voltage. After selenium surge suppressor 12 begins to substantially conduct, the voltage on the power line may continue to rise, if the voltage continues to rise capacitor 10 continues to store energy and selenium surge suppressor 12 continues to conduct. After the transient line voltage rises past the firing voltage of metal oxide varistor 14 and after a delay period of approximately 50 nanoseconds, metal oxide varistor 14 begins to substantially conduct, flattening or suppressing the voltage transient even further by shunting a portion of the transient and clamping the line voltage. If the transient is sufficiently large and has a long time duration the line voltage continues to rise, capacitor 10 continues to store energy and both selenium surge suppressor 12 and metal oxide varistor 14 continue to conduct. Selenium surge suppressor 12 is capable of dissipating approximately 800 joules and metal oxide varistor 14 can dissipate approximately 80 joules in the preferred embodiment. After the transient voltage rises past the firing voltage of gas tube 16 and after a delay period of approximately 0.1 microsecond, gas tube 16 enters into an arcing mode in which a large amount of energy (e.g. 30,000 amps at the arc voltage) is dissipated and the power line voltage is driven to a point well below the peak voltage of the power line, i.e., approximately 30 volts. Capacitor 10, selenium surge suppressor 12 and metal oxide varistor 14 continue to act in parallel to substantially reduce the steep slope of the voltage transient until gas tube 16 enters the arcing mode. The cumulative energy dissapation and storage by capacitor 10, selenium surge suppressor 12 and metal oxide varistor 14 provides a broad range of transient energy suppression, while providing sufficient time for gas tube 16 to fire when the transient is of a long duration (i.e., 1 to 2 milliseconds). When gas tube 16 begins to arc, the voltage on the power line drops below the firing voltage thresholds of both selenium surge supressor 12 and metal oxide varistor 14, causing both to stop conducting and return to an essentially open circuit state. During this period the excess charge stored by capacitor 10 is discharged through gas tube 16, thereby returning capacitor 10 to the essentially discharged state. When gas tube 16 has dissipated the remainder of the energy of the voltage surge, the alternating current signal passes through 0 volts, and gas tube 16 deionizes and returns to its open circuit state. Thus, the entire power line filter 4, except capacitor 10, returns to a substantially open circuit state. This parallel configuration of elements causes the power line filter 4 to fail in an open mode if an element fails catastrophically. If one of the elements of the power line filter 4 (i.e., capacitor 10, selenium surge suppressor 12, metal oxide varistor 14 or gas tube 16) fails in a short circuit state, fuse and holder 8 provide a back-up fail open function that removes the power line filter 4 from the power supply and load system. The removal of the power line filter 4 from its parallel connection with the power source and the sensitive equipment prevents damage to the sensitive equipment due to a short in the power line filter 4.

Figure 2:
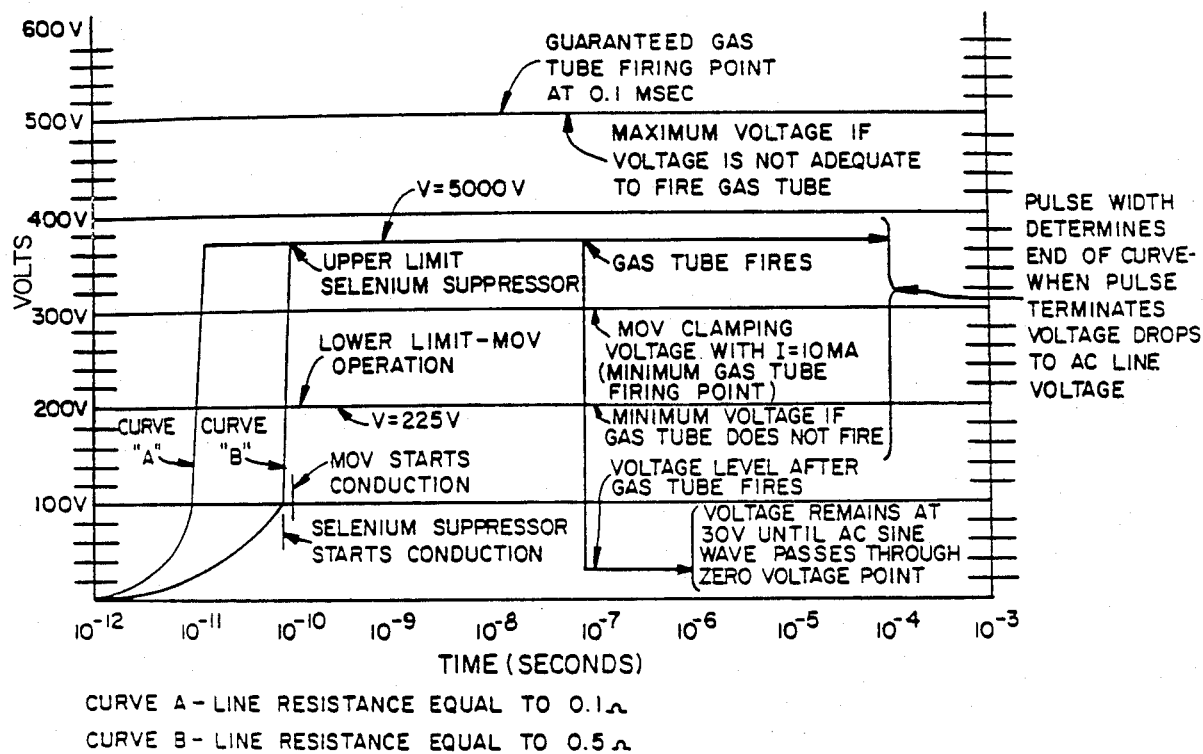
FIG. 2 is a graph illustrating the theory of operation of the power line filter illustrated in FIG. 1.

The theory of operation as well as an example of the operation of a particular power line filter 4 is illustrated by a graph in FIG. 2. The graph is based on a power line filter 4 designed for a 120 volt rms AC single phase system. Capacitor 10 is a 0.01 microfarad model 5GA S10 capacitor manufactured by Sprague, selenium surge suppressor 12 is a model SD1544-5 selenium surge suppressor manufactured by CKE, metal oxide varistor 14 is a model V150LA20A metal oxide varistor manufactured by General Electric and gas tube 16 is a model 202224 gas tube manufactured by Joslyn. FIG. 2 illustrates the minimum performance characteristics which can be expected when the power line filter 4 having the above components is subjected to a step function (zero slope) of unknown duration. Curves A and B indicate the shape of the leading edge of the output curve due to shaping by the capacitors. Curve A is based on a line resistance of 0.1 ohms and curve B on a line resistance of 0.5 ohms. At time t=0, (i.e. instantaneously) a step waveform (5000 volts) begins charging capacitor 10 providing a voltage relationship of $V_{out} = V(1 - e^{-t/RC})$, where C is the capacitance of capacitor 10 and R is the line resistance, or specifically $V_{out} = 5000[1 - e^{-t/0.5 \times 10^{-8}}]$. This corresponds to curve B of FIG. 2. At time $t = 1.15 \times 10^{-10}$ seconds (200 volts), selenium surge suppressor 12 begins to conduct and limit the voltage to a maximum of 375 volts. At time $t = 1.2 \times 10^{-10}$ seconds, metal oxide varistor 14 begins to conduct and provides additional heat dissipation to protect selenium surge suppressor 12. At time t=0.1 microsecond, gas tube 16 fires, dropping the output voltage $V_{out}$ to 30 volts. If gas tube 16 has not fired, the output voltage $V_{out}$ reverts to the normal sinusoidal waveform upon the termination of the voltage transient. If gas tube 16 is fired, the output voltage $V_{out}$ is clamped at 30 volts until a normal sinusodial waveform has passed through 0 volts.

When the power line filter 4 has a smaller transient, such as a low amplitude radio frequency transient, applied thereto, only the required components of the power line filter 4 will operate. For example, if a transient lasts for a period shorter than the reaction time of selenium surge suppressor 12 only capacitor 10 will operate. If the transient lasts longer than the reaction time of selenium surge suppressor 12, both selenium surge suppressor 12 and capacitor 10 will cumulatively operate. If the noise transient lasts longer than the reaction time of metal oxide varistor 14, the elements including capacitor 10, selenium surge suppressor 12 and metal oxide varistor 14 will act in parallel. Only rarely will gas tube 16 operate when radio frequency noise is being filtered.

Figure 3:
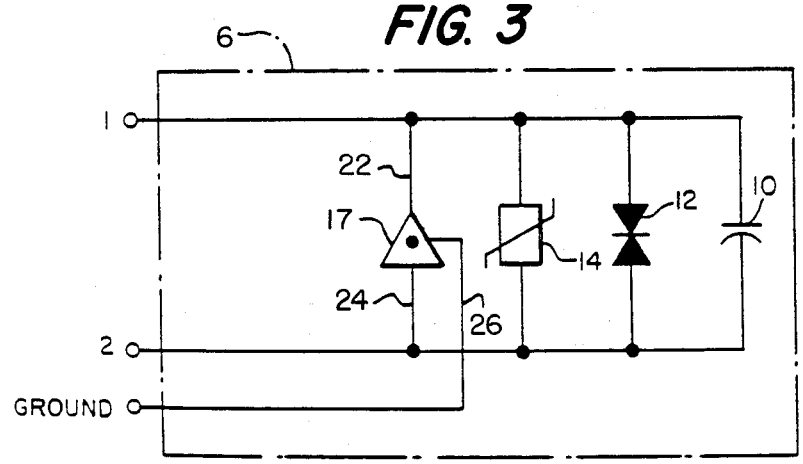
FIG. 3 is a circuit diagram of a grounded power line filter in accordance with the present invention.

FIG. 3, is a circuit diagram of a grounded version of a power line filter module 6 according to the present invention. The difference between FIG. 1 and FIG. 3 resides in the connection of three terminal gas tube 17. Three terminal gas tube 17 has leads 22 and 24 connected between terminals 1 and 2, respectively, and lead 26 connected to ground. The ground connection of gas tube 17 provides an alternate dissipation path for high energy transients.

Figure 4:
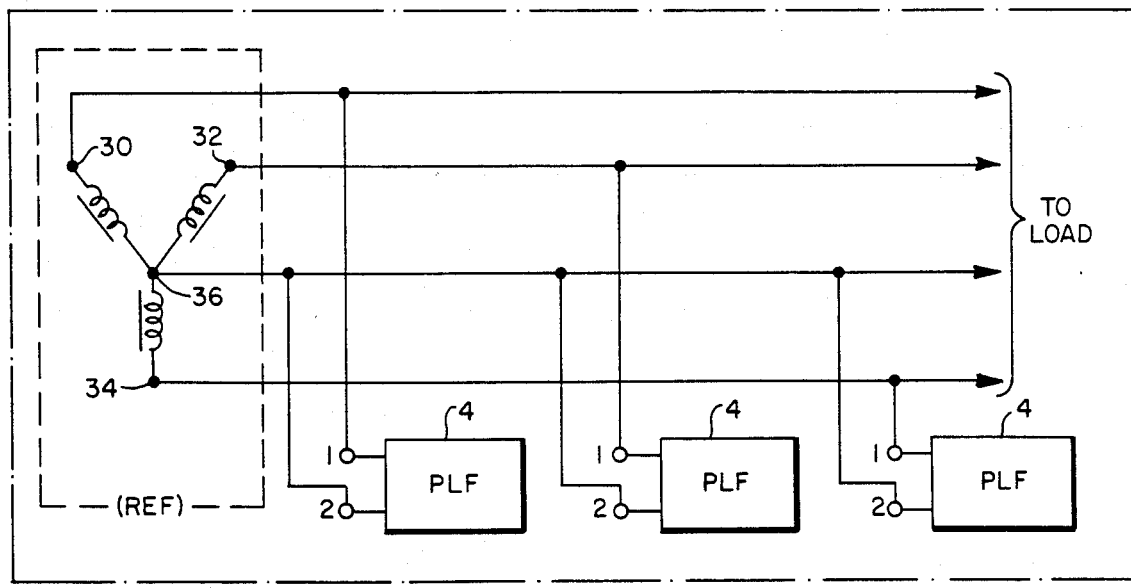
FIG. 4 is a block diagram of three power line filters connected in a three-phase wye protection arrangement according to the present invention.

FIG. 4 is a block diagram of a three-phase wye power system using three power line filters 4 (see FIG. 1) to protect a load connected to all three phases. A three-phase wye voltage source 28 is indicated on the left of FIG. 3 by the reference symbol REF and includes three phase terminals 30, 32 and 34, and a neutral terminal 36. As can be seen from the drawing, each power line filter 4 has terminal 1 connected to one of the phases 30, 32 or 34 of the power system and the second terminal connected to neutral terminal 36. A load (i.e., electronic equipment) is connected to all three phases 30 32 and 34, and neutral 36, as illustrated on the right of FIG. 4. Of course, either of the terminals 1 or 2 can be connected to one of the phases 30, 32 or 36, while the other terminal is connected to neutral 34. The circuit diagram for each of the power line filters 4 for the wye arrangement is illustrated in FIG. 1 and each of the power line filters 4 operate in the manner described with reference to FIG. 1.

Figure 5:
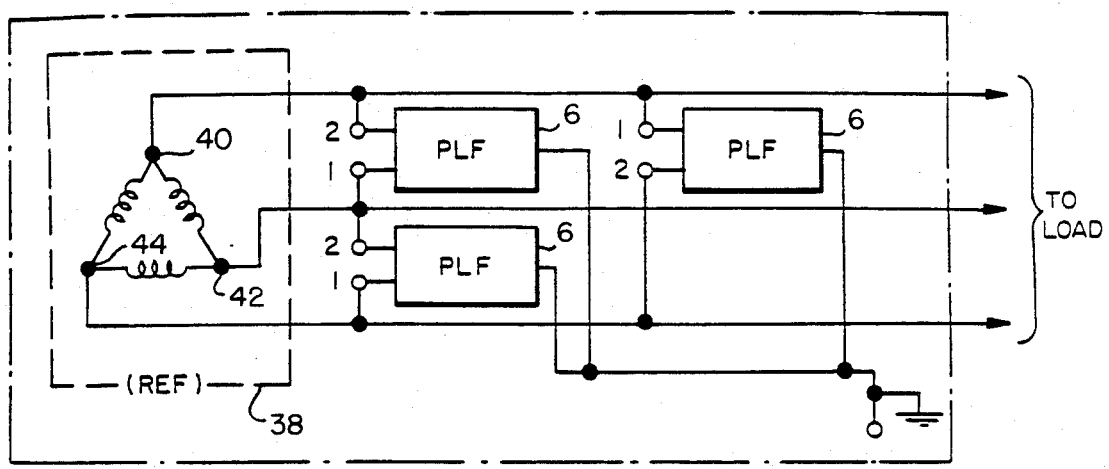
FIG. 5 is a block diagram of a grounded three phase delta power line filter protection arrangement according to the present invention.

FIG. 5 is a block diagram of a three-phase grounded delta power system using three power line filters 6 (see FIG. 3), where a source voltage 38 is represented on the left by reference symbol REF and includes three phase terminals 40, 42 and 44. A power line filter 6 is connected between each of the adjacent phases (40-42, 42-44 and 40-44), and each of the power line filters 6 is commonly connected to ground. The power line filter 6 for this delta arrangement is illustrated in FIG. 3 and operates in substantially the same manner a described with reference to FIG. 1.

Figure 6:
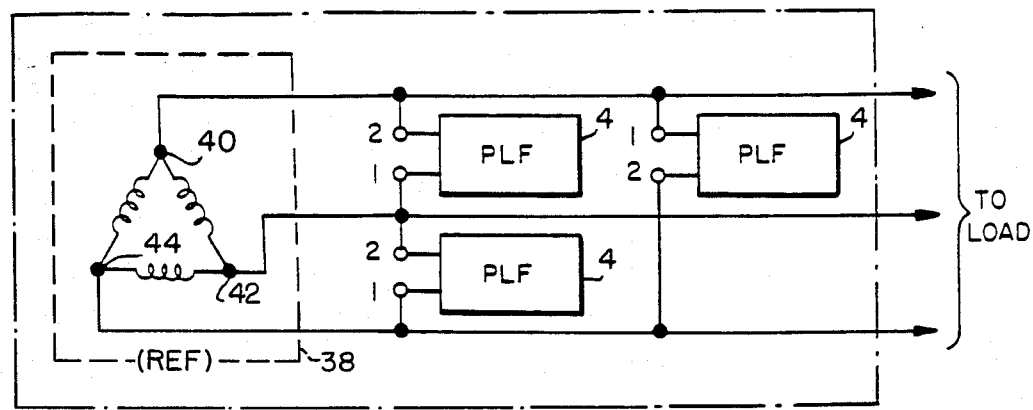
FIG. 6 is a block diagram of an ungrounded three phase delta power line filter protection arrangement according to the present invention.

FIG. 6, is a block diagram of an ungrounded three phase delta power line filter arrangement. This arrangement is substantially similar to FIG. 5 except that power line filters 4 which are not commonly connected to ground, are employed. These power line filters 4 also operate as described with reference to FIG. 1.

Figure 7:
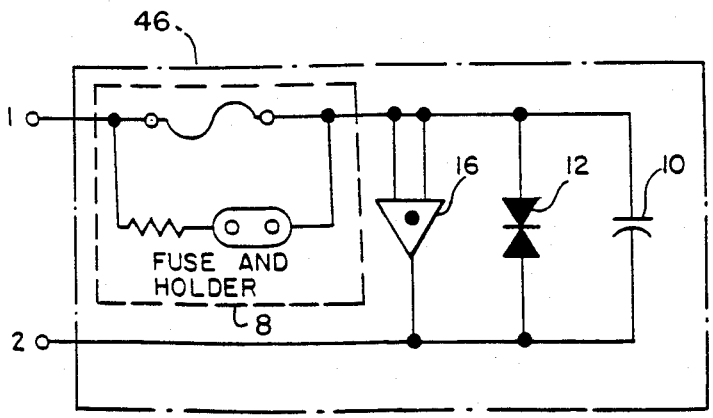
FIG. 7 is a circuit diagram of another embodiment of the alternating current power line filter of the present invention.

FIG. 7 is a circuit diagram of an embodiment of a power line filter 46 according to the present invention which eliminates the need for metal oxide varistor 14. If, for example, it is desired to protect equipment connected to a military three phase 450 volt ungrounded 400 hertz power system, and if the elements are properly chosen, the need for metal oxide varistor 14 can be eliminated. If for example, a model no. F5005-02 gas tube manufactured by Joslyn, a model no. SD-4112-30 selenium surge suppressor manufactured by CKE and a model number TRW PLF-2 1.0 microfarad capacitor manufactured by TRW and designed for 450 volt 400 hertz operation are used as gas tube 16, selenium surge suppressor 12 and capacitor 10, the elimination of metal oxide varistor 14 becomes possible because selenium surge suppressor 12 is capable of absorbing a sufficient amount of energy to allow gas tube 16 sufficient time to fire.

Figure 8:
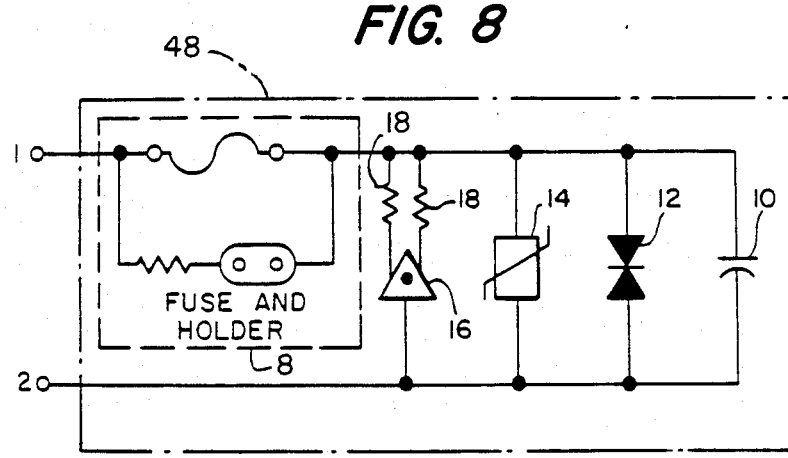
FIG. 8 is a circuit diagram of still another embodiment of the alternating current power line filter of the present invention.

FIG. 8 is a circuit diagram of a power line filter 48 useful for operation in an environment where it is necessary to restrict heat dissipation by gas tube 16. In this embodiment, resistors 18 are connected in series with gas tube 16 to provide a current limiting and therefore heat dissipation limiting capability. This embodiment would be used in a temperature sensitive environment such as enclosed portable test equipment. Of course, the provision of resistors 18 reduces the capability of the power line filter 48 to dissipate large amounts of energy but nevertheless maintains the ability to respond instantaneously to the voltage transient.

Figure 9:
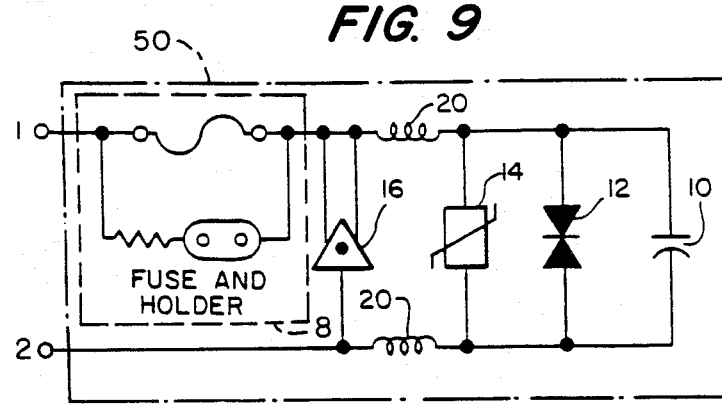
FIG. 9 is a circuit diagram of a further embodiment of the power line filter of the present invention.

FIG. 9 is a circuit diagram of another power line filter 50 according to the present invention where coils or chokes 20 are provided between the gas tube 16 and the parallel combination of metal oxide varistor 14, selenium surge suppressor 12 and capacitor 10. Alternatively, ferrite beads can be provided in series with capacitor 10. This embodiment limits the high frequency dissipation capability of the power line filter 50 and would be used, for example in situations where the power line is used as a signal carrier as well as power source, however, this embodiment lowers the need for a substantial amount of capacitance 10.

Figure 10:
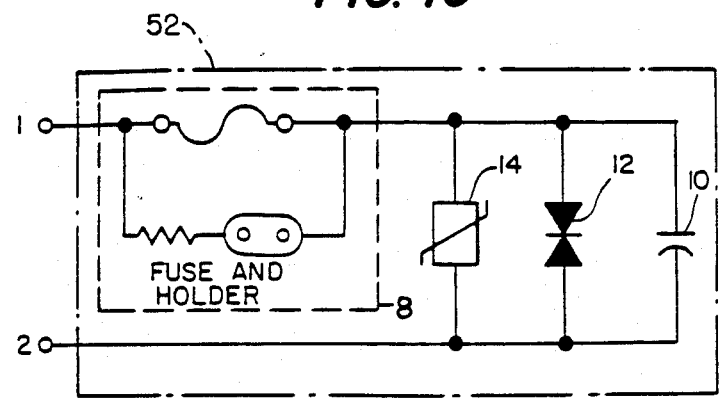
FIG. 10 is a circuit diagram of a direct current embodiment of the power line filter of the present invention.

FIG. 10 is a circuit diagram of a direct current embodiment of a power line filter 52 according the the present invention. The direct current power line filter 52 does not include a gas tube 16 because the use of gas tube 16 may require a zero voltage crossing in order to extinguish any arc that may occur, and may include one or more capacitors 10 similar to the filter described with reference to FIG. 1. Thus, the direct current power line filter 52 does not dissipate as large an amount of energy as the alternating current versions which include the gas tube 16. The sequence of operation of the direct current version is substantially similar to the sequence described earlier with reference to FIG. 1.

The power line filter module of the present invention provides transient surge suppression or dissipation of electromagnetic interference having a broad frequency range and very large amplitudes, transverse mode and common mode interference protection, as well as against electrical ground loop noise interference inherent within electrical systems. Capacitor 10 acts at all times to store some of the energy of every transient that is filtered by the power line filter. Selenium surge suppressor 12 provides a larger dissipation capability and a fast reaction time, and acts in concert and cumulatively with capacitor 10 to dissipate a large transient. Still larger transients use the dissipation capability of metal oxide varistor 12 which operates in concert and cumulatively with the selenium surge suppressor 12 and capacitor 10. When the transient is even larger and of a longer duration, gas tube 16 operates to cut off selenium surge suppressor 12 and metal oxide varistor 14, thereby protecting them from overload. At the same time gas tube 16 discharges the excess energy stored in capacitor 10. As can be seen from the above description capacitor 10 operates at all times and selenium surge suppressor 12, metal oxide varistor 14 and gas tube 16 are activated sequentially, while selenium surge suppressor 12 and metal oxide varistor 14 are turned off in parallel.

The many features and advantages of the present invention are apparent from the detailed specification and thus it is intended by the appended claims to cover all such features and advantages of the system which fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

I claim:

1. A power line filter, having first and second terminals connected line-to-line or line-to-neutral, for dissipating a line-to-line and/or both a line-to-line and a line-to-neutral transient received over a period of time and for clamping a line-to-line voltage and/or both a line-to-line voltage and line-to-neutral voltage during the period of time, the period of time being defined by first, second, third and fourth time periods, said power line filter comprising:

energy storage means, operatively connected between the first and second terminals, for storing the energy of the received transient during the first time period and for storing part of the energy of the received transient during the second and third time periods, said energy storage means comprising a capacitor;

first clamping means, operatively connected between the first and second terminals, beginning operation during the second time period, for shunting a part of the energy of the received transient and clamping the line voltage during the second and third time periods, said second clamping means comprising a selenium surge suppressor having an energy dissipation capability of at least 800 joules;

second clamping means, operatively connected between the first and second terminals, beginning operation during the third time period, for shunting a part of the energy of the transient and clamping the line voltage in conjunction with said first clamping means during the third time period; and shunt means, operatively connected between the first and second terminals, beginning operation during the fourth time period, for shunting the energy of the received transient during the fourth time period, for turning off said first and second clamping means at the beginning of said fourth time period and for discharging the energy stored in said energy storage means during the first through third time period, thereby clamping the line-to-line voltage and/or both the line-to-line and the line-to-neutral voltage for the time period.

2. A power line filter as recited in claim 1, wherein said shunt means is a gas tube.

3. A power line filter as recited in claim 1, wherein said first clamping means is a metal oxide varistor.

4. A power line filter, having first and second terminals, for dissipating a transient and for clamping a line voltage, comprising:

a capacitor, operatively connected between the first and second terminals, for storing a part of the energy of the transient;

a selenium surge suppressor, operatively connected between the first and second terminals, for shunting a second part of the energy of the transient and for clamping the line voltage and having an energy dissipation capability of at least 300 joules;

a metal oxide varistor, operatively connected between the first and second terminals, for shunting a third part of the energy of the transient and clamping the line voltage during an overlap period while said selenium surge suppressor is shunting the second part; and a gas tube, operatively connected between the first and second terminals, for shunting a fourth part of the energy of the transient, for discharging said capacitor and for turning off said selenium surge suppressor and said metal oxide varistor.

5. A power line filter as recited in claim 4, wherein said gas tube is connected to ground.

6. A power line filter as recited in claim 4, further comprising a resistor operatively connected between said gas tube and one of the first or second terminals.

7. A power line filter as recited in claim 4, further comprising a choke operatively connected between said gas tube and said capacitor, said selenium surge suppressor and said metal oxide varistor.

8. A power line filter as recited in claim 4, 5, 6 or 7, further comprising a fuse operatively connected between one of the first or second terminals and said capacitor, said selenium surge suppressor, said metal oxide varistor and said gas tube.

9. A power line filter for dissipating a transient and for clamping a line voltage on a three-phase wye power system having first, second and third phases and a neutral, comprising:

first, second and third power line filter modules, said first power line filter module operatively connected between the first phase and neutral, said power line filter module operatively connected between the second phase and neutral, and said third power line filter module operatively connected between the third phase and neutral, each of said power line filter modules comprising:

a capacitor, operatively connected between the respective phase and neutral, for storing a first part of the energy of the transient;

a selenium surge suppressor, operatively connected between the respective phase and neutral, for shunting a second part of the energy of the transient and clamping the line voltage; and having an energy dissipation capability of at least 800 joules;

a gas tube, operatively connected between the respective phase and neutral, for shunting a third part of the energy of the transient, for discharging said capacitor and for turning off said selenium surge suppressor; and a metal oxide varistor, operatively connected between the respective phase and neutral, for shunting a fourth part of the transient and for clamping the line voltage during an overlap when said selenium surge suppressor is operating and being turned off by said gas tube, said metal oxide varistor operating in parallel with said selenium surge suppressor when said selenium surge suppressor operates.

10. A power line filter for dissipating a transient and for clamping a line voltage on a three-phase delta power system having first, second and third phases, comprising:

first, second and third power line filter modules, said first power line filter module operatively connected between the first and second phases, said second power line filter module operatively connected between the second and third phases and said third power line filter module operatively connected between the first and third phases, each of said power line filter modules comprising:

a capacitor, operatively connected between the respective phases, for storing a first part of the energy of the transient;

a selenium surge suppressor, operatively connected between the respective phases, for shunting a second part of the energy of the transient and clamping the line voltage, and having an energy dissipation capability of at least 800 joules;

a gas tube, operatively connected between the respective phases, for shunting a third part of the energy of the transient, for discharging said capacitor and for turning off said selenium surge suppressor; and a metal oxide varistor, operatively connected between the respective phases, for shunting a fourth part of the energy of the transient and for clamping the line voltage during an overlap when said selenium surge suppressor is operating and being turned off by said gas tube, said metal oxide varistor operating in parallel with said selenium surge suppressor when said selenium surge suppressor operates.

11. A power line filter as recited in claim 10, wherein said gas tubes of said first, second and third power line filter modules are operatively connected to ground.

12. A direct current power line filter, having first and second terminals, for dissipating a received transient and for clamping a line voltage during first, second and third time periods, comprising:

energy storage means, operatively connected between the first and second terminals, for storing a first part of the energy of the transient and for clamping the line voltage during the first and second time periods, said energy storage means comprising a capacitor;

first clamping means, operatively connected between the first and second terminals, for shunting a second part of the transient and for clamping the line voltage during the second time period, said first clamping means comprising a selenium surge suppressor having an energy dissipation capability of at least 800 joules; and second clamping means, operatively connected between the first and second terminals, for shunting a third part of the energy of the transient and for clamping the line voltage during the third time period, said first clamping means continuing to shunt and clamp during the third time period if said second clamping means operates, said first clamping means discharging the first part of the energy of the transient if said second clamping means does not operate, and said first and second clamping means discharging the first part of the energy of the transient in conjunction with each other when both the first and second clamping means operate.

13. A direct current power line filter as recited in claim 12, wherein said second clamping means is a metal oxide varistor.

* * * * *